United States Patent [19]

Chamberlain

[11] 4,107,722
[45] Aug. 15, 1978

[54] PHOTODIODE STRUCTURE HAVING AN ENHANCED BLUE COLOR RESPONSE

[75] Inventor: Savvas Georgiou Chamberlain, Waterloo, Canada

[73] Assignee: International Business Machines Corporation, Armonk, N.Y.

[21] Appl. No.: 854,877

[22] Filed: Nov. 25, 1977

Related U.S. Application Data

[63] Continuation of Ser. No. 717,052, Aug. 23, 1976, abandoned.

[51] Int. Cl.$^2$ ............................................. H01L 27/14
[52] U.S. Cl. ....................................... 357/30; 357/88; 357/89; 357/90
[58] Field of Search ........................ 357/30, 89, 88, 90

[56] References Cited

U.S. PATENT DOCUMENTS

| | | | |
|---|---|---|---|
| 3,601,668 | 8/1971 | Slater | 317/234 R |
| 3,978,509 | 8/1976 | Gowin | 357/30 |
| 4,001,864 | 1/1977 | Gibbons | 357/30 |

OTHER PUBLICATIONS

Forbes, *I.B.M. Tech. Discl. Bull.*, vol. 15, No. 4, Sep. 1972, p.1348.

*Primary Examiner*—Martin H. Edlow
*Attorney, Agent, or Firm*—John J. Goodwin

[57] ABSTRACT

Image detectors and scanners employing $n^+$- p photodiodes as the photosensitive element tend to have a low blue color response relative to the red color output due to loss of photogenerated carriers near the diode surface because of surface recombination, and because of a small minority carrier lifetime due to the high doping level of the n-region relative to the acceptor doping density of the substrate. The surface recombination and low lifetime cause loss of quantum efficiency at wavelengths less than 4200 Å, which is the blue region. An improved photodiode is provided including a silicon p substrate, a junction formed by a phosphorous diffusion of low doping density, and a high dose of arsenic or phosphorous ion implantation to provide a shallow implant to create a built-in electric field which repels the photogenerated minority carriers away from the surface and towards the junction to be collected.

6 Claims, 3 Drawing Figures

PHOTODIODE STRUCTURE HAVING AN ENHANCED BLUE COLOR RESPONSE

This is a continuation of application Ser. No. 717,052 filed 8/23/76, now abandoned.

BACKGROUND OF THE INVENTION

1. Field of the Invention

The present invention relates generally to photoconductor structures including photosensitive elements responsive to incident radiation and more particularly to photoconductor structures having a wide range of response including sensitivity in the blue and red light wavelength regions.

2. Description of the Prior Art

It has been recognized in the prior art that photoconductor elements exhibit lower sensitivity at short or blue wavelengths than at higher or red wavelengths. One way to provide uniform sensitivity over both ranges of wavelength is to employ a filter or the like to reduce the sensitivity of the device at the red color to conform to the lower sensitivity at the blue color. This of course results in a photoconductor having an overall low sensitivity. An example of a structure which is designed to provide increased sensitivity in the blue light range rather than employ a filter is described in U.S. Pat. No. 3,900,882 issued Aug. 19, 1975 to Fukai et al on an application entitled "Photoconductor Element", filed Mar. 29, 1974 and assigned to Matsushita Electric Industrial Co. In this patent a photoconductor element is composed of selected materials such as An, Cd, Te and In arranged in a hetero-junction in order to provide the aforesaid increased blue light sensitivity. The present invention is quite distinct from the Fukai et al patent and other known prior art in that it does not employ selected materials to form a complex heterojunction but instead uses an ion implant and a phosphorous diffusion to create a built in electric field to prevent carrier surface recombination.

It is also recognized in the prior art that photodetectors for laser detection can be fabricated such that the doping concentration of the layers is selected to create a high electric field distribution in the multiplying junction and a lower electric field in the absorber so that the lower field in the absorber moves the photogenerated carriers toward the multiplying junction. An example of such device is described in U.S. Pat. No. 3,889,284 issued June 10, 1975 to Schiel on an application entitled "Avalanche Photodiode with Varying Bandgap", filed Jan. 15, 1974 and assigned to the United States of America.

The present invention is distinct from the Schiel type prior art in that such art does not relate to improving the lower blue wavelength response of a photodiode by the type of shallow implant to be described. Specifically, the Schiel patent uses added InAs doping to lower the device bandgap as the wavelength of the light being detected increases.

Finally attention is directed to U.S. Pat. No. 3,873,828 issued Mar. 25, 1975 to Hunsperger et al on an application entitled "Integrated Optical Detector" filed Aug. 23, 1973 and assigned to Hughes Aircraft Company. This patent discusses the use of ion implantation in a semiconductor optical detector, however the implantation is employed to create active defect centers to shift an absorption edge to render the substrate less absorbing. This use of ion implantation is totally distinct from the principles of the present invention.

SUMMARY OF THE INVENTION

An object of the present invention is to provide an improved photoconductor structure having an enhanced blue color light response.

Another object of the present invention is to provide an improved photoconductor structure including a photodiode having an improved quantum efficiency.

A further object of the present invention is to provide an improved photodiode for silicon scanners which is compatible with integrated circuit technologies.

Still another object of the present invention is to provide an improved photodiode for silicon scanners employing a shallow ion implant at the silicon surface to create an electric field which reduces carrier surface recombination, increases the lifetime of the carriers, and enhances the blue color response of the scanner.

The foregoing and other objects, features and advantages of the invention will be apparent from the following more particular description of a preferred embodiment of the invention, as illustrated in the accompanying drawings.

DESCRIPTION OF THE PREFERRED EMBODIMENTS

Figure 1:
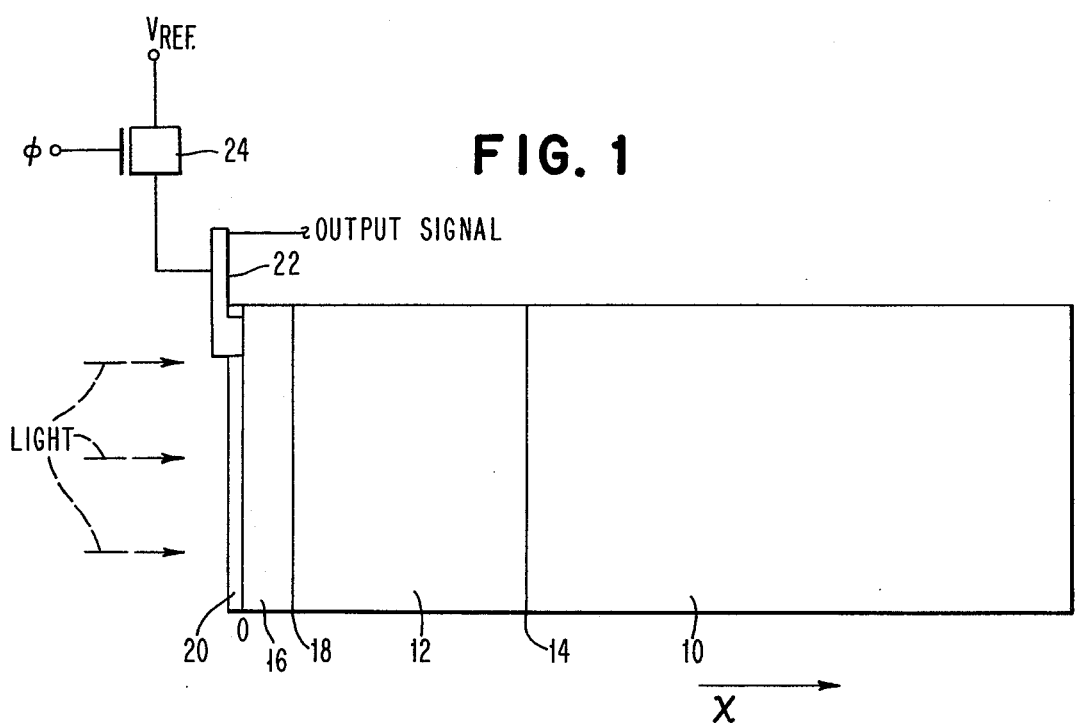
FIG. 1 is a cross-section illustration of an embodiment of a photodiode structure according to the principles of the present invention.

Referring to FIG. 1, a schematic cross-sectional illustration of one example of a photodiode structure is shown including, as a specific example for purposes of explanation, a p-type silicon substrate 10 having a 10Ω-cm. resistivity, an $n^-$ region 12 is formed of ion implanted phosphorous of $6.5 \times 10^{13} cm^{-2}$ concentration at 200 KeV, resulting in a junction 14, and an $n^+$ region 16 is formed of ion implanted arsenic $5 \times 10^{14} cm^{-2}$ concentration at 15KeV resulting in another junction 18. Typical values for the junction depths of 18 and 14 are 500 Å and 1.0 micron respectively. An insulating layer 20 formed of silicon dioxide is located at the end of the structure on the surface to be exposed to the incident radiation.

An output contact 22, composed for example of aluminum, is shown connected to the $n^+$ region 16 through a hole in the insulating layer 20 to conduct an output signal. Output contact 22 may also be connected adjacent to the n+ region as an alternative arrangement. A source of reference voltage $V_{ref}$ is connected to contact 22 via an active device 24 which is actuated by a phase signal in a conventional manner. In the specific example discussed, $V_{ref}$ is approximately 10 volts.

Figure 2:
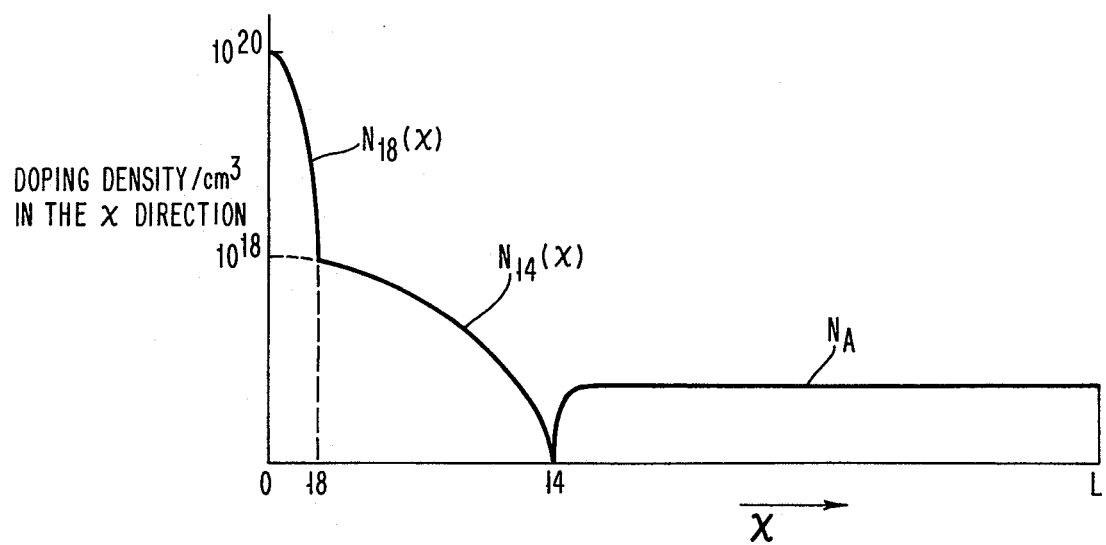
FIG. 2 is an illustration of the impurity profile of the structure of FIG. 1.
Figure 3:
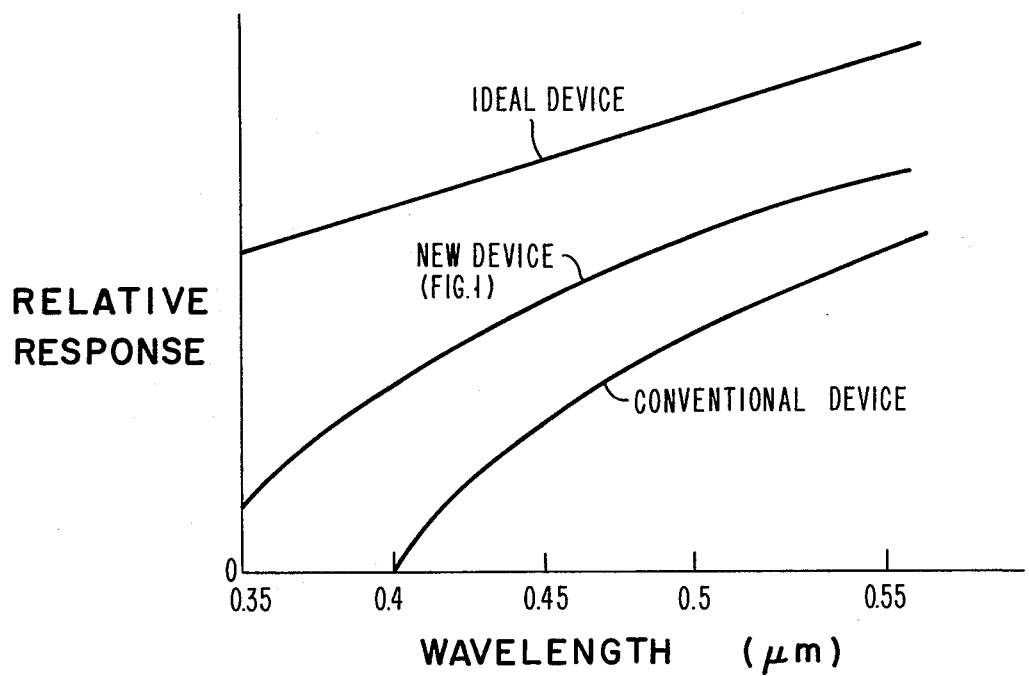
FIG. 3 is an illustration of a waveform showing the relative responses of an ideal photodiode, the photodiode of the present invention, and a conventional diode over a range of operating wavelengths.

The impurity profile of the structure of FIG. 1 is illustrated in FIG. 2 and includes the profiles $N_{18}(x)$, $N_{14}(x)$ and $N_A$ associated with the $n^+$, $n^-$ and $p$ type regions respectively. The profile $N_{18}(x)$ creates a built in electric field $E_x$ which is given by $$E_x = - KT/q \cdot [1/N_{18}(x)] \cdot [dN_{18}(x)/dx]$$

where $K$ is the Boltzmann's constant, $T$ is the absolute temperature, and $q$ is the electron charge.

This built in electric field is in the right direction so as to repel the photogenerated minority carriers away from the left surface of the photodiode structure. Aided by diffusion and the built in electric field, the minority carriers will be driven towards the junction 14 to be collected. Light wavelengths greater than 3500 Å penetrate deeper than 500 Å and therefore most of the photogenerated carriers are screened from the surface. The low impurity density $N_{14}(x)$ in the region 12 ensures that the lifetime of the carriers is not degraded and that the carrier recombination rate is maintained low. This results in an improvement in the minority carrier diffusion length in the $n^-$ region.

More particularly, when illumination is directed onto the device as illustrated in FIG. 1, the donor atoms (i.e., the phosphorous atoms of region 12 and the arsenic atoms of region 16) give up electrons leaving the regions 16 and 12 with a positive ionized charge. The region 16 at the device surface is more ionized and therefore more positive than region 12. Region 16 is more positive with respect to region 12 by about $6KT/2$ where $KT/2$ is the thermal voltage, 0.025 Volt at room temperature. The positive regions repel the positive photogenerated holes toward the collection region which is at the space charge layer of junction 14. The electrons from the p-type substrate region 10 also naturally go toward the junction 14. Another advantage of the present invention is that the problem of the loss of carriers in the $n^+$ region in conventional photodiodes is minimized in the present invention because of the relatively low concentration of donor impurities in region 12. The minority carrier diffusion length in region 12 is large for the device of FIG. 1.

The photodiode of FIG. 1 can be employed in bucket-brigade device scanners. An alternative embodiment of the invention can also be applied to buried or bulk channel CCD-type scanners by one skilled in the art using the teachings set forth relative to the embodiment of FIG. 1.

While the invention has been particularly shown and described with reference to the preferred embodiment thereof, it will be understood by those skilled in the art that various changes in form and details may be made therein without departing from the spirit and scope of the invention.

What is claimed is:

1. A photodiode device for radiation responsive image detectors comprising:
   a semiconductor substrate of a p conductivity type,
   a first layer of material having a first selected doping density of n-type conductivity, said first layer disposed on said substrate to form a first n-p junction at a first depth,
   said first selected doping density of said first layer being a relatively low doping density,
   and a second layer of material having a second selected doping density of n-type conductivity greater than the doping density of said first layer, said second layer disposed on said first layer to form a second junction at a second depth at least an order of magnitude less than said first depth of said first junction, said second selected doping density of said second layer being within one order of magnitude greater than said first selected doping density resulting in an n-n-p junction device,
   wherein said first junction is relatively deep and has a relatively low doping density with respect to said relatively shallow, higher doping density second junction,
   said second layer having an outer surface opposite to said second junction upon which radiation may be directed and said first and second n-conductivity type layers being responsive to radiation on said surface of second layer to produce minority carriers and wherein said doping densities of said first and second layers are selected for producing an electric field for directing said minority carriers away from said surface of said second layer and toward said first n-p junction,
   said second junction functioning to screen said minority carriers from said surface of said second layer and to permit said relatively low doping density in said first layer to maintain the lifetime of said minority carriers.

2. A photodiode device according to claim 1 further including an insulating layer over the said surface of said second layer.

3. A photodiode device according to claim 1 wherein said substrate is composed of silicon material containing acceptor impurities.

4. A photodiode device according to claim 1 wherein said first layer of n-conductivity impurity material having said first selected doping density is composed of phosphorous.

5. A photodiode device according to claim 1 wherein said second layer of n-conductivity impurity material having said first selected doping density is composed of arsenic.

6. A photodiode device according to claim 1 wherein said second layer of n-conductivity impurity material having said second doping density is composed of phosphorous.

* * * * *